(12) United States Patent
Kamata et al.

(10) Patent No.: US 7,785,948 B2
(45) Date of Patent: Aug. 31, 2010

(54) SEMICONDUCTOR ELEMENT AND PROCESS FOR PRODUCING THE SAME

(75) Inventors: Toshihide Kamata, Tsukuba (JP); Takehito Kozasa, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 703 days.

(21) Appl. No.: 11/659,105

(22) PCT Filed: Aug. 19, 2005

(86) PCT No.: PCT/JP2005/015138

§ 371 (c)(1), (2), (4) Date: Feb. 1, 2007

(87) PCT Pub. No.: WO2006/019157

PCT Pub. Date: Feb. 23, 2006

(65) Prior Publication Data
US 2009/0140235 A1 Jun. 4, 2009

(30) Foreign Application Priority Data
Aug. 20, 2004 (JP) ............................ 2004-240185

(51) Int. Cl.
*H01L 21/336* (2006.01)
(52) U.S. Cl. .................. 438/197; 438/279; 438/285
(58) Field of Classification Search .............. 257/40; 438/147–166, 197, 279–291
See application file for complete search history.

(56) References Cited

U.S. PATENT DOCUMENTS 5,622,896 A * 4/1997 Knotter et al. .............. 438/123

2004/0149680 A1 * 8/2004 Ohmi .......................... 216/13

FOREIGN PATENT DOCUMENTS

| JP | A 59-207812 | 11/1984 |
|---|---|---|
| JP | A 60-145903 | 8/1985 |

(Continued)

OTHER PUBLICATIONS

S. Fritz et al., "Effect of Dielectric Roughness on Performance of Pentacene TFTs and Restoration of Performance with a Polymeric Smoothing Layer", J. Phys. Chem. B, vol. 109, No. 21, pp. 10574-10577, (2005).

(Continued)

*Primary Examiner*—Dung A. Le
(74) *Attorney, Agent, or Firm*—Oliff & Berridge, PLC

(57) ABSTRACT

The present invention provides a thin film transistor having excellent formability and processability, and particularly a thin film transistor using plastics as a substrate; an organic semiconductor as an active layer; and $SiO_2$ thin films formed by coating as a sealing layer and a gate insulating layer, and a process for producing the same. The present invention provides a field-effect type thin film transistor having an active layer of an organic semiconductor, comprising on a plastic substrate, a sealing layer of a $SiO_2$ thin film formed by coating; a gate electrode; a gate insulating layer of a $SiO_2$ thin film formed by coating; gate and drain electrodes; and a semiconductor active layer. The high-quality $SiO_2$ thin film is obtained by using a silicon compound as a starting material and irradiating a coated thin film of the solution of the starting material with light in an oxygen atmosphere.

11 Claims, 6 Drawing Sheets

FOREIGN PATENT DOCUMENTS

| | | |
|---|---|---|
| JP | A 6-073340 | 3/1994 |
| JP | A 6-299118 | 10/1994 |
| JP | A 6-306329 | 11/1994 |
| JP | A 7-196986 | 8/1995 |
| JP | A 7-223867 | 8/1995 |
| JP | A 7-292321 | 11/1995 |
| JP | A 9-031333 | 2/1997 |
| JP | A 9-157544 | 6/1997 |
| JP | A 11-105187 | 4/1999 |
| JP | A 2000-243943 | 9/2000 |
| JP | A 2000-340557 | 12/2000 |
| JP | A 2001-110802 | 4/2001 |
| JP | A 2004-134694 | 4/2004 |

OTHER PUBLICATIONS

S. Okur et al., "High-Mobility Pentacene Phototransistor with Nanostructured $SiO_2$ Gate Dielectric Synthesized by Sol-Gel Method", Microelectron. Eng. (2009).

* cited by examiner

SEMICONDUCTOR ELEMENT AND PROCESS FOR PRODUCING THE SAME

TECHNICAL FIELD

This invention relates to thin-film transistor elements having excellent formability and processability, and more particularly, to flexible transistor elements using an organic semiconductor material for an active layer and a technique for producing the transistor elements.

BACKGROUND ART

The technology of forming thin-film transistors on a substrate having plasticity such as plastics is extremely important for the implementation of flexible electronic devices such as electronic paper. In particular, the techniques for producing thin-film transistors at low temperature in a simple process such as printing have received a great deal of attention because this acts as a trigger for a significant reduction in production costs. With this aim in mind, great expectations are now placed on organic thin-film transistors using as an active layer an organic semiconductor which can be produced by a coating technique such as printing.

In such an organic thin-film transistor, it is expected that the use of a thin-film of an inorganic compound such as a $SiO_2$ thin film as an insulating layer will be adequate for the purpose of ensuring the reliability of the transistor performance.

A $SiO_2$ thin film has been applied to various functional films, thin films for electronic devices, and the like, due to its high degree of insulating properties, dielectric strength and sealing properties, as well as its mechanical strength, abrasion resistance, chemical resistance, heat resistance, scuff resistance, optical transparency, and the like. Particularly in recent years, various functional materials using a plastic film having plasticity have been proposed, where the various uses of a $SiO_2$ thin film have been devised for imparting the required function. Examples of the devisal include impartment of film-mar-proof properties, anti-reflection function, chemical resistance and the like.

Representative processes for producing the $SiO_2$ thin film include thermal oxidation of silicon to form a $SiO_2$ thin film on the surface. This is the most frequently used technique for producing a thin film for electronic devices. However, this process has a drawback that it is not applicable to the case where a silicon substrate is not used, and therefore it cannot be used in general purposes, since the substrate is limited to silicon in this process. Another common process for forming the $SiO_2$ thin film is a process in a vacuum, representative of which includes a sputtering method or a CVD method. However, in a process using such a vacuum stage, sufficiently high surface smoothness is not necessarily obtained when producing a thicker film, thus raising the disadvantages of a decrease in insulating properties and the like resulting from the surface roughness. Further, a process in a vacuum has the disadvantage that adaptability to a large area is not always easy, leading to a significant increase in production costs.

To overcome these disadvantages, various methods of solution coating for producing the $SiO_2$ thin film have been investigated. Sol-gel method is well known as the process for producing the $SiO_2$ thin film through coating. However, sol-gel method requires firing at elevated temperature of 400° C. or more to form a high quality thin film, and this method also gives rise to the disadvantages that a sufficiently densified film is not easily produced and satisfactory surface smoothness is not ensured.

In these circumstances, it has been reported that when producing $SiO_2$ by hydrolysis of a silicon compound such as a silazane compound as a starting material, a densified and high-quality $SiO_2$ thin film can be produced. Various processes of forming a $SiO_2$ thin film using a silicon compound as a starting material have been heretofore investigated. However, when a silicon-compound thin film is converted to a $SiO_2$ thin film by the usual hydrolysis reaction, a firing step at high temperature of 400° C. or more is involved, and therefore resulting in the disadvantage that the $SiO_2$ thin film cannot be produced on a plastic substrate.

Since the process using the conversion reaction of the silicon compound provides a $SiO_2$ thin film with high film quality, it may possibly have a potential as the technology for forming the $SiO_2$ thin film using the coating technique. For this reason, various techniques for enabling the conversion reaction at lower temperature so as to be applicable to a plastic substrate have been investigated. In order to reduce the processing temperature of the hydrolyzing process of silazane compounds as a starting material to produce $SiO_2$, addition of a catalyst such as amines, acids, platinum, palladium or aluminum to the starting material has been reported (see patent documents 1, 2, 3, 4, 5, 6 described later). However, when the catalyst is added as described above, the added catalyst cannot be easily removed after formation of the $SiO_2$ thin film, and it often remains in the $SiO_2$ thin film. If the catalyst remains in the thin film as described above, the catalyst serves as an impurity, thus giving rise to the degradation of the insulating properties, when the thin film is used as a thin film for electronic elements which requires high insulating properties.

As a process for reacting the starting material at low temperature without the addition of a catalyst or the like, the process for achieving the reaction by immersing a thin film of silazane-compound in a solution containing a catalyst such as amines, acids, platinum, palladium or aluminum has been reported (see patent document 7 described later). However, also in this case, the catalyst is incorporated into the converted $SiO_2$ thin film due to adsorption for example, since the reaction is achieved by immersion in the catalyst-containing solution. Therefore, it becomes a cause of the degradation in insulating properties and the like.

On the other hand, it has been proposed to substitute the silazane compound used for the starting material with an alkyl group and the like, and to mix a carbon-containing component in the silazane compound, in order to enhance the reactivity (see patent documents 8, 9 described later). However, when the starting material contains the carbonous component, high-temperature processing is required for the removal of the carbonous component, resulting in difficulty in producing a thin film at low temperature. Also, when a thin film is used as an electronic functional material in the state that organic components remain in the thin film, the disadvantage of reduction of the insulating properties or the dielectric strength are caused by decrease in the denseness.

In order to convert the silazane compound to $SiO_2$ by a hydrolysis reaction, firing under conditions with an adequate humidity is indispensable. However, when producing the thin film under conditions of moisture, the moisture is adsorbed to the thin film, and in turn the adsorbed moisture becomes a cause of deterioration of insulating properties if the thin film is adapted for use in an electron element. In order to remove the adsorbed water, a process such as firing at high temperature, heating in a vacuum atmosphere or the like is still necessary. As a result, it is necessary to conduct a process step of treating at high temperature or in a vacuum atmosphere, resulting in the disadvantage of increasing the complication and the cost of the process steps.

[Patent Document 1] Japanese Patent Application Laid-open No. 6-299118 (1994)

[Patent Document 2] Japanese Patent Application Laid-open No. 6-306329 (1994)

[Patent Document 3] Japanese Patent Application Laid-open No. 7-196986 (1995)

[Patent Document 4] Japanese Patent Application Laid-open No. 9-031333 (1997)

[Patent Document 5] Japanese Patent Application Laid-open No. 9-157544 (1997)

[Patent Document 6] Japanese Patent Application Laid-open No. 11-105187 (1999)

[Patent Document 7] Japanese Patent Application Laid-open No. 7-223867 (1995)

[Patent Document 8] Japanese Patent Application Laid-open No. 6-073340 (1994)

[Patent Document 9] Japanese Patent Application Laid-open No. 7-292321 (1995)

[Patent Document 10] Japanese Patent Application Laid-open No. 59-207812 (1984)

[Patent Document 11] Japanese Patent Application Laid-open No. 60-145903 (1985)

DISCLOSURE OF THE INVENTION

Problems to be Solved by the Invention

The present invention provides a thin-film transistor element having excellent formability and processability, and more specifically, to a thin-film transistor in which plastics having plasticity as a substrate, an organic semiconductor as an active layer and a $SiO_2$ thin film formed by coating as a sealing layer and a gate insulating layer are used, and a process for producing the thin-film transistor.

Means for Solving the Problems

The present inventors have diligently studied a process for producing various high-purity $SiO_2$ thin films at low temperature and by a coating technique, under the presupposition that an insulating layer should be made from a high-quality $SiO_2$ thin film with high reliability in order to produce a thin film transistor having excellent formability and processability by use of a coating process and to use it to obtain a highly reliable transistor element. Here, the present invention has been made as a result of diligent study under the presupposition that it may be necessary to accomplish a conversion reaction without the addition of an additive or the like to a starting material with high purity in order to produce a high-purity $SiO_2$ thin film at low temperature and by coating technique, and the conversion reaction may be possible by adopting a reaction other than a hydrolytic reaction.

Specifically, the present invention provides a thin film transistor, which is a field-effect type transistor having an active layer comprising an organic semiconductor, the thin film transistor comprising on a plastic substrate having plasticity, a sealing layer formed of a thin film including at least one layer of a $SiO_2$ thin film formed by coating; a gate electrode; a gate insulating layer formed of a thin film including at least one layer of a $SiO_2$ thin film formed by coating; gate and drain electrodes; and a semiconductor active layer. The high-quality $SiO_2$ thin film has excellent properties as an insulating layer, and also has excellent gas barrier properties and moisture permeability resistance, thus effectively exerting the performance as the sealing layer.

Further, the present invention also provides a process for producing a thin film transistor characterized in that, in the foregoing thin film transistor, the $SiO_2$ thin film forming the sealing layer and the gate insulating layer is formed by: using a silicon compound as a starting material, a silicon compound having either silazane structure having general formula (1), representative of which is cyclosilazane, oligosilazane, or polysilazne, or siloxane structure having general formula (2), representative of which is alkylsiloxane or an alkoxysilane compound; coating a solution of the starting material to form a thin film; and irradiating the thin film with ultraviolet light in an atmosphere including oxygen to covert the thin film to $SiO_2$.

[chemical formula 1] (1)

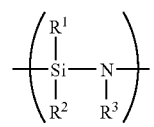

[chemical formula 2] (2)

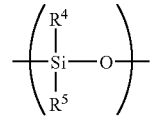

(wherein $R^1$, $R^2$, $R^3$, $R^4$, and $R^5$ independently represent a substituent group selected from the group consisting of a hydrogen atom, an alkyl group, an alkenyl group, an alkoxy group, a hydroxyalkyl group, a carboxylalkyl group, an alkylcarbonyl group, an alkoxycarbonyl group, an alkylcarbonyloxy group, an aromatic hydrocarbon group and an aromatic heterocyclic group.)

The $SiO_2$ thin film produced by converting the silazane compound exhibits small shrinkage or expansion during the reaction, since the film has a small structural distortion with respect to the starting-material thin film. Thus, it is known that the conversion reaction is not likely to provide structural defects and the like, and therefore a densified $SiO_2$ thin film is formed.

It is known that ultraviolet irradiation in an atmosphere including oxygen gives rise to decomposition of an oxygen molecule so as to generate ozone or atomic oxygen.

When a silazane compound comprising silazane structure reacts with ozone or atomic oxygen, $SiO_2$, ammonia and oxygen are generated in accordance with the following equations (3) and (4).

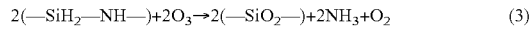

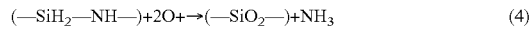

This reaction is possible to produce $SiO_2$ at a temperature around room temperature without the use of additive and the like, since a rise in temperature is unnecessary to initiate the reaction, and the reaction can proceed without the use of catalyst. Further, there is little possibility that an impurity remains in the thin film, thus producing high purity $SiO_2$, since all of a reactant fed for the reaction and substances emitted from the reaction are gases, that is, the reactant is oxygen and the substances emitted from the reaction are ammonia and oxygen. It is possible to prevent degradation in insulating properties due to residual adsorbed water or the like, since water is not used for the reaction. Further, in the case of the present invention, due to significantly high reactivity to active ozone or atomic oxygen, the reaction can be advanced until Si—N bond virtually completely disappears, thus producing high purity $SiO_2$.

When the silicon compound comprising siloxane structure reacts with ozone or atomic oxygen, $SiO_2$, carbon dioxide and water are generated in accordance with the following equations (5) and (6).

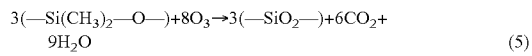

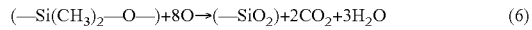

This reaction can produce $SiO_2$ at a temperature around room temperature without the use of additive and the like, since a rise in temperature is unnecessary to initiate the reaction, and the reaction can proceed without the use of catalyst. High purity $SiO_2$ thin film can be produced in combination with heating process at a temperature of 100° C. or more, since the reaction for converting alkylsiloxane to produce $SiO_2$ generates a trace of water as an emission substance from the reaction.

Further, the present invention provides a process for producing ozone and atomic oxygen which are reacted with the silicon compound by irradiating oxygen with ultraviolet light. This process achieves a process step in which the possibility of contamination with impurities during the reaction is eliminated. Thus, high purity $SiO_2$ is produces substantially without possibility of incorporation of impurities into the thin film.

Further, the present invention provide a process for forming the $SiO_2$ thin film, characterized in that the silicon oxide thin film is fired at a temperature of 150° C. or less either during or after the ultraviolet irradiation.

Further, the present invention provides a thin film transistor characterized in that, the $SiO_2$ thin film forming the gate insulating layer in said thin film transistor has a surface roughness of 0.5 nm or less in RMS value.

Further, a typical embodiment of the present invention provides a field effect type transistor characterized in that the transistor has a sealing layer 20 on a substrate 10, a gate electrode 30, a gate insulating layer 40, a source or drain 50 and a semiconductor layer 60, wherein the sealing layer 20 and the gate insulating layer 40 are composed from a $SiO_2$ thin film formed by coating.

ADVANTAGES OF THE INVENTION

The thin film transistor of the present invention is easily produced and enables the achievement of a film element, a large-area element and a flexible element, since it can be produced on a plastic substrate with plasticity by means of coating. Further, the thin film transistor of the present invention results in increase of element stability and lifetime, since the sealing and insulating layers is composed from highly stable metallic oxides.

(A) A thin-film XPS pattern after a conversion reaction to $SiO_2$ wherein peaks due to 2p and 2s orbital of Si and 1s orbital of O are shown, which are constitutional elements; and (B) An XPS pattern of a thin film before a conversion reaction wherein peaks due to 2p and 2s orbital of Si and 1s orbital of N are shown, which are constitutional elements.

Figure 4:
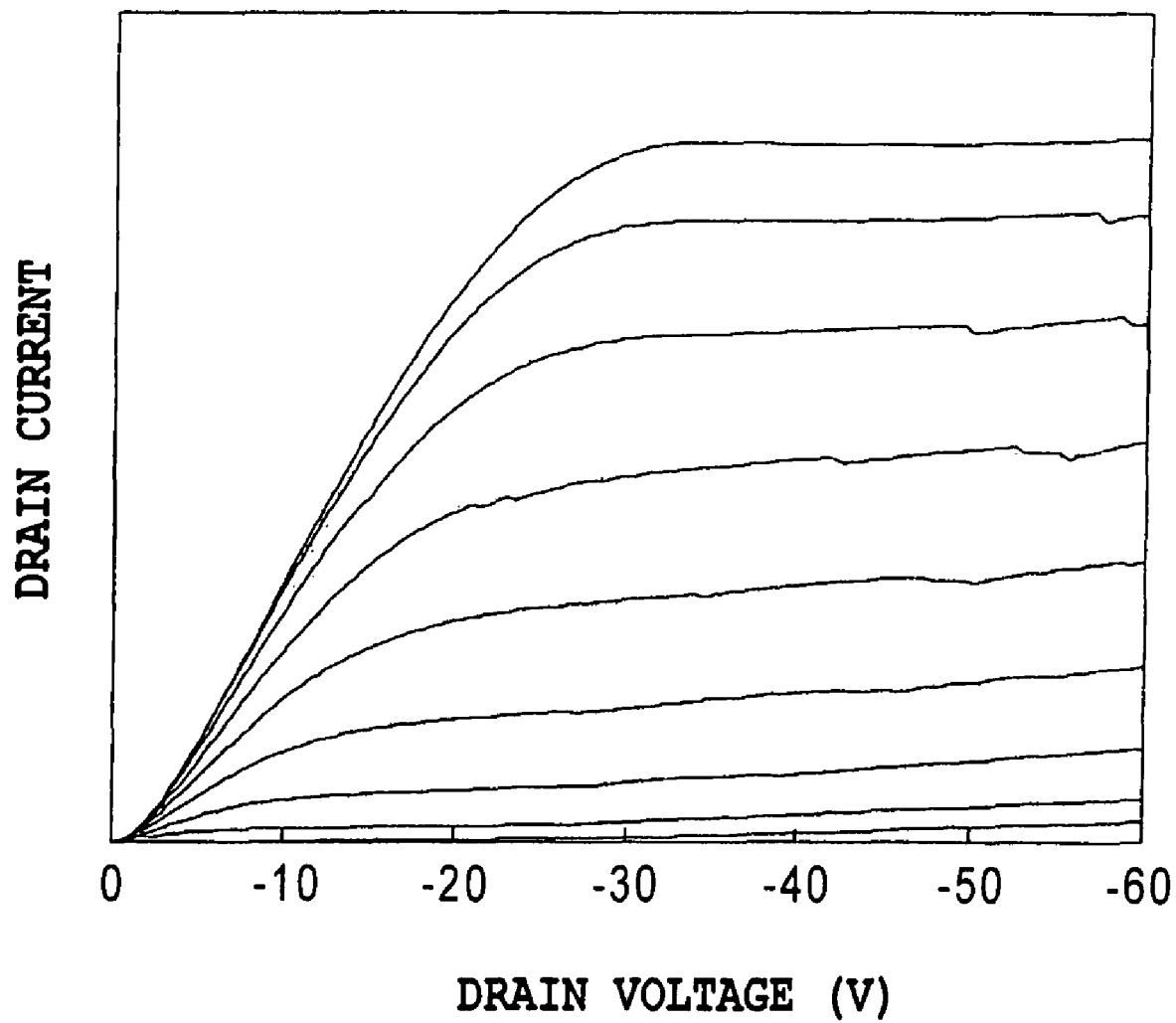

FIG. 4 shows the output characteristics of a thin film transistor produced in Example 10 of the present invention.

Figure 5:
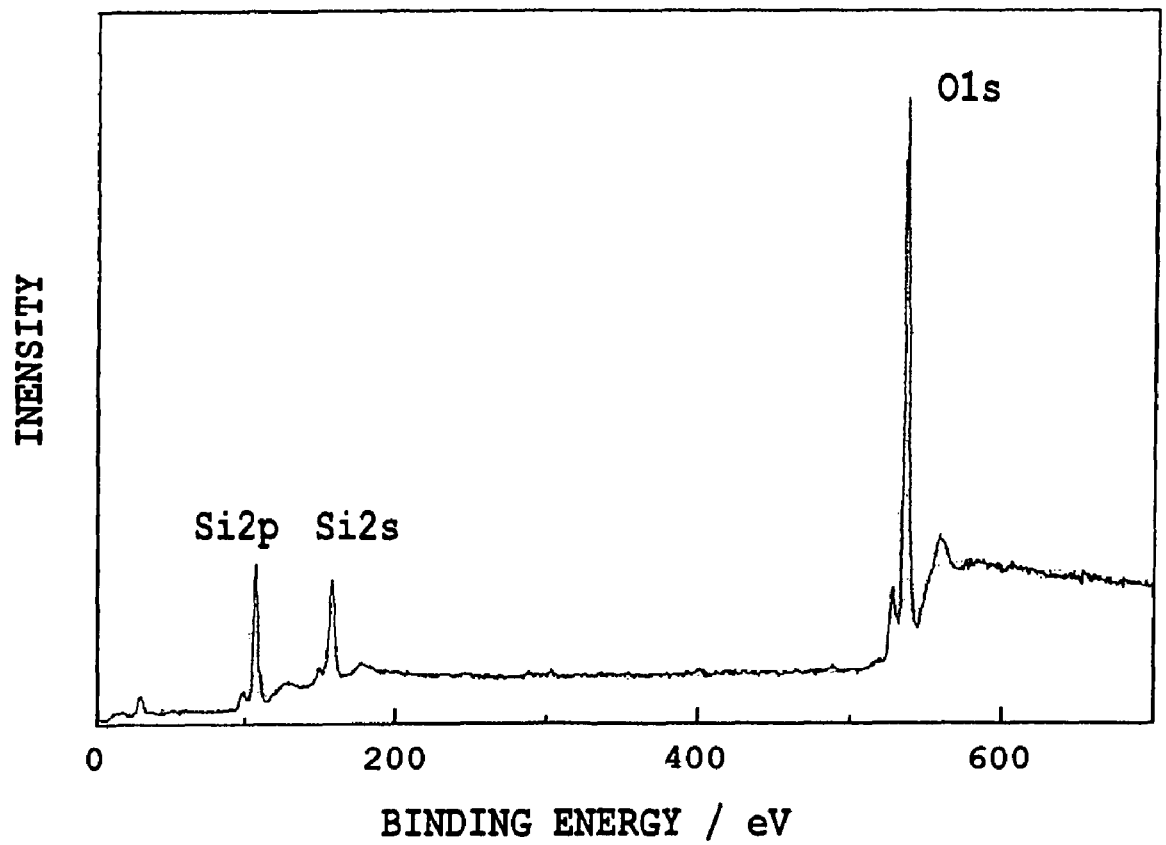

FIG. 5 shows an XPS pattern of a thermally oxidized film of silicon in Reference Example 1 of the present invention.

Figure 6:
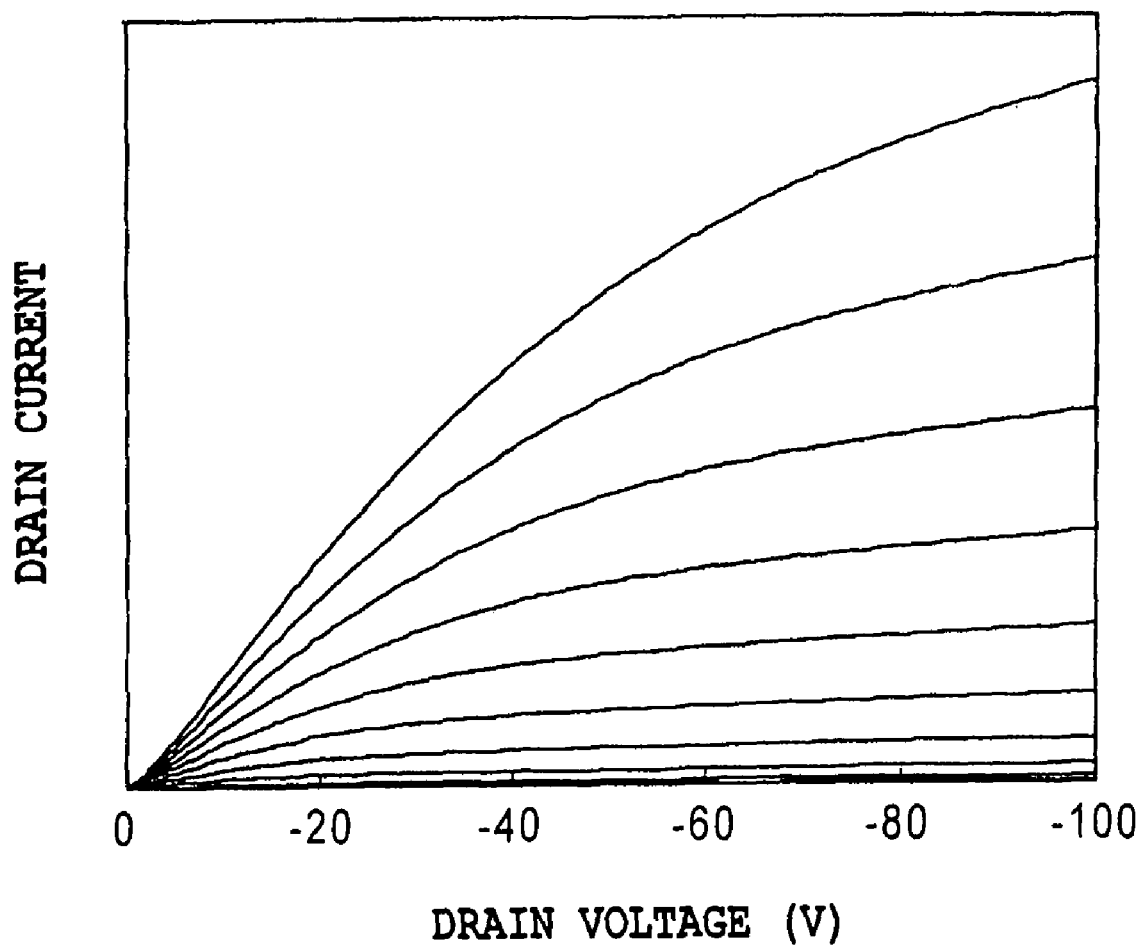

FIG. 6 shows the output characteristics of a thin film transistor produced in Reference Example 1 of the present invention.

EXPLANATION OF REFERENCE NUMERALS

10 SUBSTRATE IN EXAMPLE OF PRESENT INVENTION
20 SEALING LAYER IN EXAMPLE OF PRESENT INVENTION
30 GATE ELECTRODE IN EXAMPLE OF PRESENT INVENTION
40 GATE INSULATING LAYER IN EXAMPLE OF PRESENT INVENTION
50 DRAIN AND SOURCE ELECTRODES IN EXAMPLE OF PRESENT INVENTION
60 SEMICONDUCTOR ACTIVE LAYER IN EXAMPLE OF PRESENT INVENTION

BEST MODE FOR CARRYING OUT THE INVENTION

The present invention will be described below in detail.

Sealing layer 20 and gate insulating layer 40 of a thin film transistor used in the present invention are each formed of a $SiO_2$ thin film formed by a coating process. The $SiO_2$ thin film is obtained by conversion of a coated thin film of a silicon compound having a silazane structure, typically cyclosilazane, oligosilazane and polysilazne, or a silicon compound having a siloxane structure, typically alkylsiloxane and an alkoxysilane compound. For the silicon compound used as a starting material in this stage, compounds having the foregoing general formulas (1) and (2) may be used, in which $R^1$, $R^2$, $R^3$, $R^4$ and $R^5$ are independently composed from a substituent group selected from the group consisting of a hydrogen atom, an alkyl group, an alkenyl group, an alkoxy group, a hydroxyalkyl group, a carboxylalkyl group, an alkylcarbonyl group, an alkoxycarbonyl group, an alkylcarbonyloxy group, an aromatic hydrocarbon group and an aromatic heterocyclic group. The molecular chain of the silicon compound may have any structure: linear structure, cyclic structure, cross-linked structure or the like. Alternatively, mixture of the silicon compounds can be used. The molecular weight of the silicon compound is not particularly limited and the silicon compound with any molecular weight can be used. However, generally used silicon compound has a molecular weight of 100 to 100,000, and more preferably used silicon compound has a molecular weight of 200 to 10,000. The molecular weight distribution is not particularly limited and any molecular weight distribution may be employed. The foregoing, silicon compounds within the above-described generally used range of molecular weight may have any dispersion in molecular weight.

Sealing layer 20 and gate insulating layer 40 of the thin film transistor used in the present invention are each formed as a $SiO_2$ thin film by: using as a starting material a silicon compound having a silazane structure or siloxane structure; coating the starting material to form an initial thin film; and converting the initial thin film. The coating method for the silicon compound thin film in this stage is not particularly limited. The generally used coating methods include a spin coating method, a dip coating method, a cast coating method, a spray coating method, an inkjet method, a transfer coating method, and the like. Further, a general printing technique can be used, such as typographic printing, stencil printing, offset lithography, or gravure printing, which are progressed form of the above coating method. Also, a printing technique so-called soft lithography such as micro-contact printing, micromolding can be applied.

The silicon compound thin film used in the present invention is formed by the coating method. As a solvent used in this method, aromatic hydrocarbon, aliphatic hydrocarbon, alicyclic hydrocarbon, halogenated hydrocarbon, halogenated aromatic hydrocarbon, ethers, amines, and the like can be used. Solvents generally suitable for use include benzene, toluene, xylene, ethylbenzene, cyclohexane, methyl cyclohexane, pentane, hexane, heptane, octane, nonane, decane, diethyl ether, dipropyl ether, dibutyl ether, methyl ethyl ketone, methyl isobutyl ketone, tetrahydrofuran, chloroform, methyl chloride, pyridine, and the like. For this use, the solvent is desirably purified to a high degree, and is desirably subjected fully to desiccation treatment.

The thickness of the silicon compound thin film used in the present invention obtained by single step of applying the coating is 5 nm or more and 10 µm or less, preferably 50 nm or more and 2 µm or less.

The silicon compound thin film used in the present invention is formed by way of the process step of removing the solvent after coating to form a film. In this process step, the thin film is heated to remove the solvent. A temperature and an atmosphere in heating and the like may vary as appropriate depending on the solvent used, however it is generally desirable that the heating temperature is 150° C. or lower. Also, it is desirable that the atmosphere in which the silicon compound thin film is placed in the heating step is at atmospheric pressure. Also, the time required for heating for the removal of the solvent in this process step is not particularly limited. The required time is generally a minute or more and 180 minutes or less, and preferably from 5 minutes to 60 minutes.

In the present invention, it is desirable to use a controllable atmosphere in which the silicon compound thin film is converted to a $SiO_2$ thin film.

In the present invention, atomic oxygen and ozone obtained by irradiating a gas including oxygen with ultraviolet light are used for converting the silicon compound thin film to the $SiO_2$ thin film.

In the present invention, ultraviolet irradiation is performed in an atmosphere including oxygen for converting the silicon compound thin film to the $SiO_2$ thin film. In this process step, the wavelength of the ultraviolet light radiated is not particularly limited. The generally used wavelength of the ultraviolet light ranges from 100 nm to 450 nm. Light with such wavelengths can be provided by a deuterium lamp, a xenon lamp, a metal halide lamp, an excimer lamp, a mercury lamp and the like as well as an excimer laser and the like.

Sealing layer 20 and gate insulating layer 40 of the thin film transistor used in the present invention are formed of a $SiO_2$ thin film by: using as a starting material a silicon compound having a silazane structure or siloxane structure; coating the starting material to form an initial thin film; and converting the initial thin film. The process temperature for converting the silicon compound thin film to the $SiO_2$ thin film is generally 0° C. or more and 200° C. or less, preferably 10° C. or more and 150° C. or less. The time required for the conversion reaction in this stage is not particularly limited. Typically, it is a minute or more and 720 minutes or less, desirably from 5 minutes to 120 minutes.

In the present invention, the silicon compound formed in thin film form is converted to $SiO_2$ to obtain a $SiO_2$ thin film. In this process step, the number of conversion reactions occurring is not limited to one. A final $SiO_2$ thin film may be obtained by repeating a plurality of application of the silicon compound thin film and a plurality of the reactions of converting the silicon compound to the $SiO_2$. The thickness of this $SiO_2$ thin film is not particularly limited. The thickness of the $SiO_2$ thin film generally used is 5 nm or more and 50 µm or less, preferably 10 nm or more and 2 µm or less.

Figure 1:
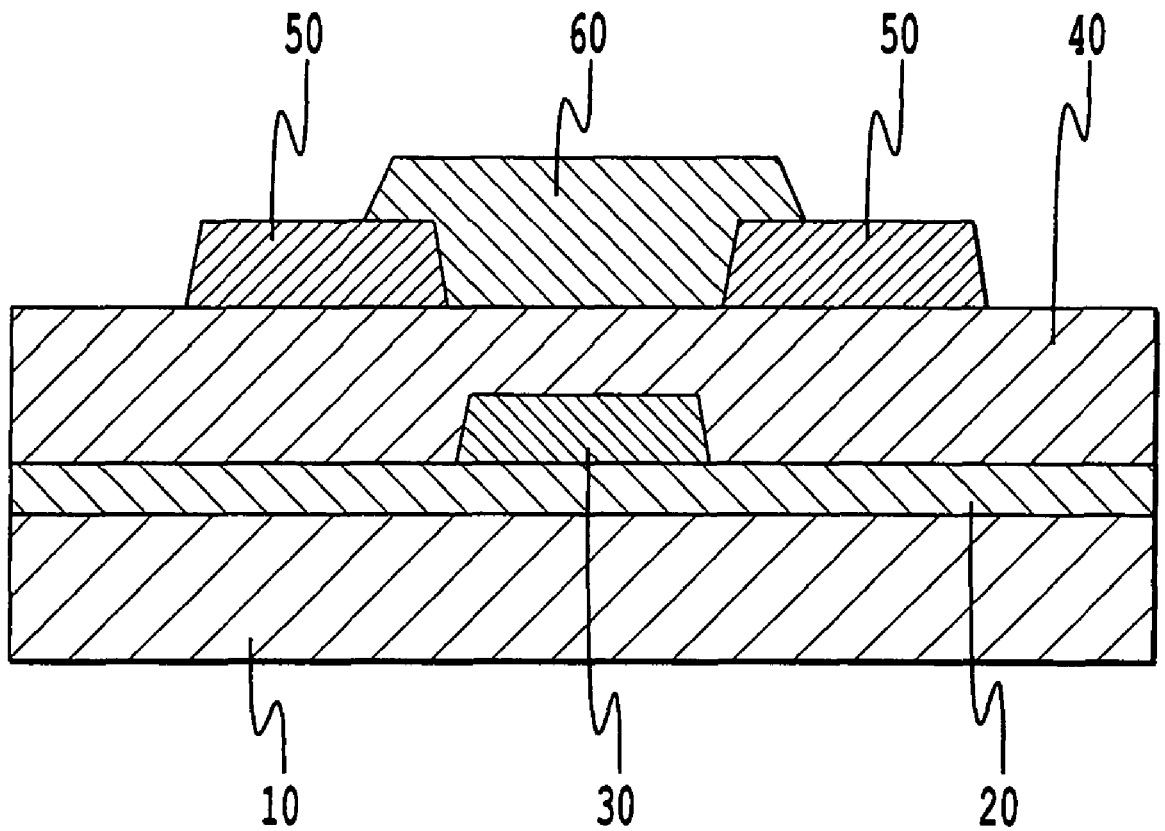
FIG. 1 shows the schematic sectional view of an embodiment of a thin film transistor in the present invention.

An example of the structure of the thin film transistor used in the present invention is a bottom contact configuration illustrated in FIG. 1. However, the arrangement of the source and drain electrodes and the arrangement of the semiconductor layers are not particularly limited. A top contact configuration may be employed, in which the source and drain electrodes are formed over the semiconductor layer.

$SiO_2$ gate insulating layer 40 used in the present invention has a thickness of 10 nm or more and 5000 nm or less, preferably 100 nm or more and 1000 nm or less. Here, the insulating layer 40 may be constituted from a single layer, or alternatively may be constituted from a stack of a plurality of layers. Here, it is necessary that the thin film constituted from a stack a plurality of layers includes at least one layer of the $SiO_2$ thin film, and the remaining layers may be thin-film layers made of different materials.

$SiO_2$ gate insulating layer 40 used in the present invention has a surface roughness of 0.5 nm or less in RMS value (Root-Mean-Square value). The surface roughness exceeding 0.5 nm becomes a factor in giving rise to structural defect in a channel region when the thin film transistor is produced, thus significantly degrading the performances such as mobility, threshold voltage, and the like of the thin film transistor. In order to facilitate the formation of source and drain electrodes 50 and semiconductor layer 60 on the insulating layer 40, the surface of the insulating layer 40 can be modified using a self-organizing film or the like for use. Used herein, RMS (Root-Mean-Square) value means a root mean square roughness value, which is obtained as the square root of the mean of the square of the deviations from the arithmetic mean value m of the cross-sectional profile f(x) in the baseline length 1.

$SiO_2$ sealing layer 20 used in the present invention has a thickness of 5 nm or more and 5000 nm or less, preferably 10 nm or more and 2000 nm or less. Here, the sealing layer 20 may be constituted from a single layer, or alternatively may be constituted from a stack of a plurality of layers. Here, it is necessary that the thin film constituted from a stack of a plurality of layers includes at least one layer of the $SiO_2$ thin film, and the remaining layers may be thin-film layers made of different materials.

$SiO_2$ sealing layer 20 used in the present invention is formed on substrate 10 and beneath gate electrode 30 and gate insulating layer 40. In order to increase sealing effect, another sealing layer may be formed on the other surface of substrate 10. The thickness in this case is 5 nm or more and 5000 nm or less, preferably 10 nm or more and 2000 nm or less. Here, the sealing layer 20 may also be constituted from a single layer, or alternatively may be constituted a stack of a plurality of layers. Here, it is necessary that the thin film constituted from a stack of a plurality of layers includes at least one layer of the $SiO_2$ thin film, and the remaining layers may be thin-film layers made of different materials.

Substrate 10 used in the present invention is not particularly limited and any substrate may be used. Generally, a desirably used substrate is a plastic substrate with flexibility such as polycarbonates, polyimides, polyethylene terephthalate (PET), polyethylene naphthalate, polypropylene, polyphenylene sulfide or the like. However, a glass, metal or ceramic substrate or the like can be used. Here, substrate 10 may comprise a mixture of a plurality of materials, or alternatively be constituted from laminated layers, or yet alternatively may be subjected to surface treatment, for the purpose of improving stability, lifetime of the element and processing properties of a sealing thin film formed thereon.

As materials for the electrodes 30 and 50 used in the present invention, metal such as gold, silver, copper, platinum, palladium, aluminum, or indium is often used, but not so limited. The process for producing the electrodes is not particularly limited, and any process may be employed. A generally used process is a vacuum producing process such as vacuum evaporation or sputtering method. However, a wet producing process using coating or adhesion of a solution can be applied, such as plated wiring, typographic printing, screen printing or inkjet printing, or the like. Here, it is possible to use a metallic fine particle paste such as a silver paste or a gold paste, a carbon paste or the like, or alternatively an organic material such as thiophene conductive polymer (PEDOT), polyaniline or derivatives thereof. Further, the electrode may comprise a mixture of a plurality of materials, or alternatively be constituted from laminated layers, or yet alternatively may be subjected to surface treatment, for the purpose of improving stability, lifetime, and efficiency of charge injection of the element.

In the thin film transistor in the present invention, an organic semiconductor material is used in semiconductor layer 60. The composition of the semiconductor layer 60 is not particularly limited, and the semiconductor layer 60 may be constituted from a single substance or may be constituted from a mixture of a plurality of substances. In addition, semiconductor layer 60 can have layer structure comprising several kinds of substances. The following materials are the known organic semiconductor materials that show excellent properties:

anthracene, tetracene, pentacene or derivatives thereof with a substituent(s) on their terminal(s); α-sexithiophene, perylene tetracarboxylic dianhydride (PTCDA), and derivatives thereof with substituent(s) on their terminal(s); naphthalene tetracarboxylic dianhydride (NTCDA), and derivatives thereof with substituent(s) on their terminal(s); copper phthalocyanine and derivatives thereof with fluorine(s) on their terminal(s); derivatives of copper phthalocyanine in which copper is substituted with nickel, titanium oxide, fluorinated aluminum, or the like, and derivatives thereof with fluorine(s) and the like on their terminal(s); fullerene, rubrene, coronene, anthradithiophene and derivatives thereof with substituent(s) on their terminal(s); and polyphenylenevinylene, polythiophene, polyfluorene, polyphenylene, polyacetylene, polyallylamine, and derivative polymers thereof with substituent(s) on their terminal(s) or side chain(s).

The process for producing the semiconductor layer 60 used in the present invention is not particularly limited, and any process may be employed. Generally, a vapor deposition method such as vacuum evaporation is often used. In terms of simple production at low cost, a process by coating with a solution is desirably used. Generally used processes include a spin coating method, a dip coating method, a cast coating method, a spray coating method, an inkjet method, a transfer coating method, and the like. Further, general printing methods can be used, such as typographic printing, stencil printing, offset lithography or gravure printing, which are progressed form of the above coating method. Also, a printing technique so-called soft lithography such as micro-contact printing or micro-molding can be applied.

Example 1

The present invention will be described below in more detail using examples, however the present invention is not limited to these examples.

Figure 2:
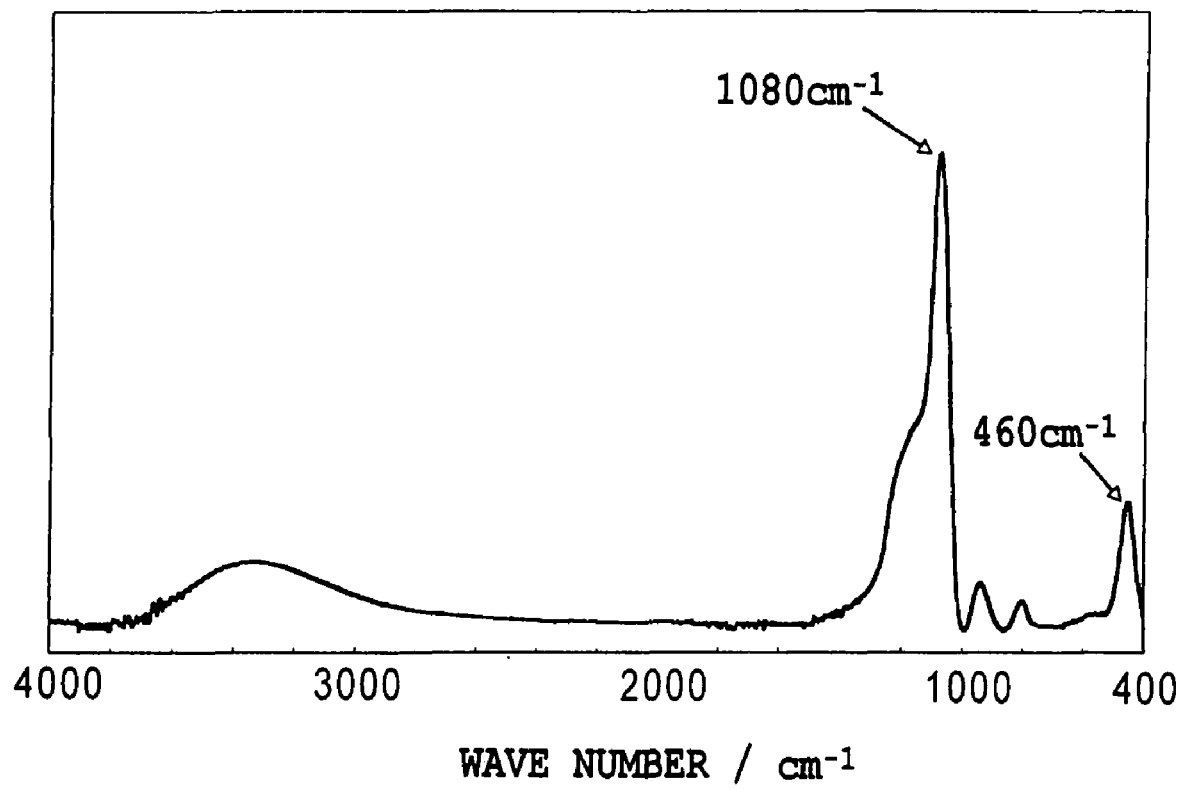
FIG. 2 shows the infrared absorption spectrum of an insulating film produced in Example 1 of the present invention.

A starting-material solution for producing a coated thin film is obtained by dissolving octamethyl cyclotetrasilazane into dibutyl ether so as to reach a concentration of about 27.4 wt %. A 2-inch silicon wafer was used as a substrate on which a $SiO_2$ thin film was produced. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 30 minutes. Then, the substrate was cleaned by running extra pure water, and then the water was removed by an air gun. Then, the substrate was placed in a Teflon (registered trademark) container of a solution resulting from dilution of an undiluted solution of hydrofluoric acid up to 100 fold with extra pure water, and then was shaken for 30 seconds. Then, the substrate was cleaned by running extra pure water, and then the water was removed by an air gun. The substrate cleaned as described above was placed on a spin coater, and then about 1.0 $cm^3$ of the starting-material solution was spread onto the substrate with a Teflon (registered trademark) syringe to which a PTFE disposable filter (pore size: 0.2 micron) was mounted. Immediately after spreading, the substrate was rotated at a speed of 700 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. A gas mixture of oxygen and nitrogen at a ratio of 8:2 was introduced into the reaction container. The pressure of the introduced gas mixture was 0.25 MPa. Then, the substrate was irradiated with light of an ultraviolet lamp (xenon excimer lamp). The irradiation time period was set at 120 minutes. The temperature in the reaction container was room temperature (26° C.). FIG. 2 shows infrared absorption spectrum of the thin film obtained after the reaction. The absorption band derived from the C—H bond of the starting material, shown around 3000 $cm^{-1}$, disappeared, and the absorption band derived from the Si—O bond showing that the thin film was converted to $SiO_2$ appeared at 1080 $cm^{-1}$ and 460 $cm^{-1}$. From these facts, it is verified that octamethyl cyclotetrasilazane of the starting material was completely converted to $SiO_2$.

Example 2

Figure 3:
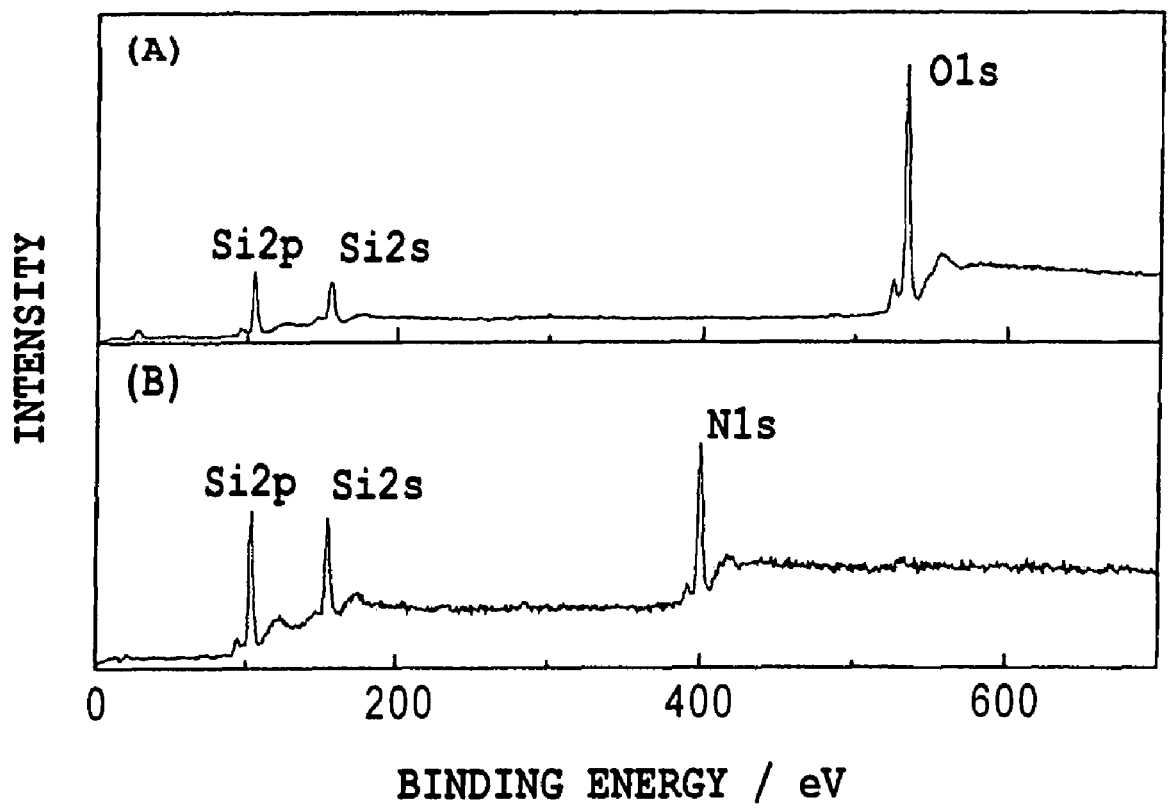
FIG. 3 shows XPS patterns of an insulting film produced in Example 2 of the present invention.

A starting-material solution for producing a coated thin film was obtained by dissolving poly(perhydrosilazane) into dibutyl ether so as to reach a concentration of about 20 wt %. A 2-inch silicon wafer was used as a substrate on which a $SiO_2$ thin film was produced. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 15 minutes. Then, the substrate was cleaned by running extra pure water, and then the water was removed by an air gun. Then, the substrate cleaned as described above was placed on a spin coater, and then about 1.0 $cm^3$ of the starting-material solution was spread onto the substrate with a glass syringe to which a PTFE disposable filter (pore size: 0.2 micron) was mounted. Immediately after spreading, the substrate was rotated at a speed of 2500 rpm for 60 seconds to obtain a uniform film of poly(perhydrosilazane). After the completion of the rotation, the substrate was left at rest on a hot plate heated at 100° C. and was heated for 5 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). After the reaction, the substrate with the thin film formed thereon was introduced as-is into a normal-pressure oven, and then was subjected to the heat treatment for one hour at a constant temperature (about 150° C.). FIG. 3(A) shows the XPS pattern of the thin film produced in this way. FIG. 3(B) shows an XPS pattern of a poly(perhydrosilazane) thin film as reference data. It is seen that the poly(perhydrosilazane) thin film of the starting material was converted completely to a high purity $SiO_2$ thin film, from the fact that the peak caused by is orbital of N, which is observed in the starting-material thin film, disappears completely in the thin film after the conversion. The obtained $SiO_2$ thin film has a thickness of about 180 nm. The thin film had a dielectric strength of about 5MV/$cm^2$, a resistivity of $10^{13}$ Ωcm, a relative dielectric constant of about 4.0, and a surface roughness of about 0.15 nm in RMS value.

Example 3

Methylsiloxane (trade name: 312B) produced by Honeywell Corporation was used as a starting-material solution for producing a coated thin film. A 2-inch silicon wafer was used as a substrate on which a $SiO_2$ thin film was produced. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 30 minutes. Then, the substrate was cleaned by running extra pure water, and then the water was removed by an air gun. Then, the substrate was placed in a Teflon (registered trademark) container of a solution resulting from dilution of an undiluted solution of hydrofluoric acid up to 100 fold with extra pure water, and then was shaken for 30 seconds. Then, the substrate was cleaned by running extra pure water, and then the water was removed by an air gun. The substrate cleaned as described above was placed on a spin coater, and then about 1.0 $cm^3$ of the starting-material solution was spread onto the substrate with a Teflon (registered trademark) syringe to which a PTFE made disposable filter (pore size: 0.2 micron) was mounted. Immediately after spreading, the substrate was rotated at a speed of 5000 rpm for 60 seconds to obtain a uniform film of methylsiloxane. After the completion of the rotation, the substrate was left at rest on a hot plate heated at 50° C. and was heated for 10 minutes, which was then immediately introduced in a reaction container. A gas mixture of oxygen and nitrogen at a ratio of 8:2 was introduced into the reaction container. The pressure of the introduced gas mixture was 0.25 MPa. Then, the substrate was irradiated with light of an ultraviolet lamp (xenon excimer lamp). The irradiation time period was set at 60 minutes. The temperature inside the reaction container was room temperature (26° C.). From the infrared absorption spectrum of the thin film obtained after the reaction, the absorption band derived from the C—H bond of the starting material, shown around 3000 $cm^{-1}$, disappeared, and the absorption band derived from the Si—O bond showing that the thin film was converted to $SiO_2$ appeared at 1080 $cm^{-1}$ and 460 $cm^{-1}$. From these facts, it is verified that methylsiloxane of the starting material was completely converted to $SiO_2$.

Example 4

A commercially available polyethylene terephthalate (PET) film was used as a substrate. The substrate was placed on a spin coater, and then about 1.0 $cm^3$ of the solution of poly(perhydrosilazane) in dibutyl ether (concentration of about 20 wt %) was spread onto the substrate with a glass syringe from above. Immediately after spreading, the substrate was rotated at a speed of 2500 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). After the reaction, the substrate with the thin film formed thereon was introduced as-is into a normal-pressure oven, and then was subjected to the heat treatment for one hour at a constant temperature (about 50° C.). The obtained $SiO_2$ thin film (sealing layer) has a thickness of about 250 nm. Onto the $SiO_2$ thin film, gold was vacuum-deposited to a thickness of 50 nm as patterned lower electrodes. The substrate was placed on a spin coater, and then about 1.0 $cm^3$ of the solution of poly(perhydrosilazane) in dibutyl ether (concentration of about 20 wt %) was spread onto the substrate with a glass syringe from above. Immediately after spreading, the substrate was rotated at a speed of 2500 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). After the reaction, the substrate with the thin film formed thereon was introduced as-is into a normal-pressure oven, and then was subjected to the heat treatment for one hour at a constant temperature (about 50° C.). The obtained $SiO_2$ thin film has a thickness of about 250 nm. The thin film had a dielectric strength of about $5MV/cm^2$, a resistivity of $10^{13}$ $\Omega cm$, and a surface roughness of about 0.32 nm in RMS value.

Example 5

A starting-material solution for producing a coated thin film is obtained by dissolving poly(perhydrosilazane) into dibutyl ether so as to reach a concentration of about 20 wt %. As a substrate on which a. $SiO_2$ thin film is formed was used a transparent glass substrate was coated with a chromium metal by a sputtering method. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 30 minutes. Then, the substrate was cleaned by running extra pure water, and then the water was removed by an air gun. Then, the substrate was placed in a Teflon (registered trademark) container of a solution as resulting from dilution of an undiluted solution of hydrofluoric acid up to 10 fold with extra pure water, and then was shaken for 30 seconds. Then, the substrate was cleaned by running extra pure water, and then the water was removed by an air gun. Then, the substrate cleaned as described above was placed on a spin coater, and then about 0.5 $cm^3$ of the starting-material solution was spread onto the substrate with a glass syringe to which a PTFE made disposable filter (pore size: 0.2 micron) was mounted. Immediately after spreading, the substrate was rotated at a speed of 2000 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 300 minutes. The temperature in the reaction container was room temperature (24° C.). After the reaction, the substrate with the thin film formed thereon was introduced as-is into a normal-pressure oven, and then was subjected to the heat treatment for one hour. The obtained $SiO_2$ thin film has a thickness of about 200 nm. The thin film had a resistivity of $10^{12}$ $\Omega cm$, and a surface roughness of about 0.19 nm in RMS value.

Example 6

A starting-material solution for producing a coated thin film is obtained by dissolving poly(perhydrosilazane) into dibutyl ether so as to reach a concentration of about 6.7 wt %. A 2-inch silicon wafer was used as the substrate on which a $SiO_2$ thin film was produced. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 30 minutes. Then, the substrate was cleaned by running extra pure water, and then the water was removed by an air gun. Then, the substrate was placed in a Teflon (registered trademark) container of a solution resulting from dilution of an undiluted solution of hydrofluoric acid up to 100 fold with extra pure water, and then was shaken for 30 seconds. Then, the substrate was cleaned by running extra pure water, and then the water was removed by an air gun. Then, the substrate cleaned as described above was placed on a spin coater, and then about 1.0 $cm^3$ of the starting-material solution was spread onto the substrate with a Teflon (registered trademark) syringe to which a PTFE disposable filter (pore size: 0.2 micron) was mounted. Immediately after spreading, the substrate was rotated at a speed of 5000 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. After the substrate had been placed in the reaction container, an oxygen-nitrogen gas was flowed at a flow rate of 3.0 L/min. The pressure of the oxygen-nitrogen gas introduced was 0.25 MPa. While flowing the oxygen gas, the substrate was irradiated with light of an ultraviolet lamp (xenon excimer lamp). The irradiation time period was set at 140 minutes. The temperature inside the reaction container was room temperature (26° C.). After the reaction, the substrate with the thin film formed thereon was introduced as-is into a normal-pressure oven, and then was subjected to the heat treatment for one hour. The obtained $SiO_2$ thin film has a thickness of about 55 nm. The thin film had a dielectric strength of about $8MV/cm^2$, and a resistivity of $10^{13}$ $\Omega cm$.

Example 7

A starting-material solution for producing a coated thin film is obtained by dissolving poly(perhydrosilazane) into dibutyl ether so as to reach a concentration of about 20 wt %. A 2-inch silicon wafer was used as the substrate on which a $SiO_2$ thin film was produced. The substrate was cleaned by the following method. The substrate was placed in a stainless container of the undiluted solution of a cleaning fluid for substrates for liquid-crystal application, i.e. Semicoclean 56 produced by Furuuchi Chemical Corporation, and then was subjected to ultrasonic cleaning for 15 minutes. Then, the substrate was transferred into a stainless container of extra pure water and then was subjected to ultrasonic cleaning for 15 minutes. Then, the substrate was cleaned by running extra pure water, and then the water was removed by an air gun. Then, the substrate cleaned as described above was placed on a spin coater, and then about 1.0 $cm^3$ of the starting-material solution was spread onto the substrate with a glass syringe to which a PTFE disposable filter (pore size: 0.2 micron) was mounted. Immediately after spreading, the substrate was rotated at a speed of 2500 rpm for 60 seconds to obtain a uniform film as a first layer of poly(perhydrosilazane). After the completion of the rotation, the substrate was left at rest on a hot plate heated at 90° C. and was heated for 5 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). Next, the substrate with the thin film formed thereon was placed again in the spin coater, and then about 1.0 cm³ of the starting-material solution was spread onto the substrate with the glass syringe, and immediately, the substrate was rotated at a speed of 2500 rpm for 60 seconds to form a second layer of poly (perhydrosilazane). After the completion of the rotation, the substrate was left at rest on the hot plate heated at 90° C. and was heated for 3 minutes, which was then immediately introduced in a reaction container. An oxygen gas was introduced into the reaction container, and the substrate was irradiated with light of an ultraviolet lamp (mercury lamp) to conduct a conversion reaction. The reaction time period was about 60 minutes, and the temperature in the reaction container was 24° C. After the reaction, the substrate with the thin films formed thereon was introduced as-is into a normal-pressure oven, and then was subjected to the heat treatment for one hour at a constant temperature (about 100° C.). The obtained $SiO_2$ thin film has a total thickness of about 450 nm. The thin film had a dielectric strength of about 4MV/cm², a resistivity of $10^{12}$ Ωcm, and a surface roughness of about 0.22 nm in RMS value.

Example 8

A commercially available polyethylene terephthalate (PET) film was used as the substrate. The substrate was placed on a spin coater, and then about 1.0 cm³ of a dibutyl ether solution of poly(perhydrosilazane) (concentration of about 20 wt %) was spread onto the substrate with a glass syringe from above. Immediately after spreading, the substrate was rotated at a speed of 2500 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). After the reaction, the substrate with the thin film formed thereon was introduced as-is into a normal-pressure oven, and then was subjected to the heat treatment for one hour at a constant temperature (about 50° C.). The obtained $SiO_2$ thin film (sealing layer) has a thickness of about 250 nm. Onto the $SiO_2$ thin film, gold was vacuum-deposited to a thickness of 50 nm as patterned lower electrodes. The substrate was placed on a spin coater, and then about 1.0 cm³ of a chloroform solution (concentration of about 0.27 wt %) of polymethyl methacrylate (PMMA) was spread onto the substrate with a glass syringe from above. Immediately after spreading, the substrate was rotated at a speed of 2000 rpm for 60 seconds to obtain a uniform film (thickness of about 10 nm) of PMMA. Further, about 1.0 cm³ of a dibutyl ether solution (concentration of about 20 wt %) of poly(perhydrosilazane) the was spread with a glass syringe onto the substrate on which the thin film had been formed, and then immediately, the substrate was rotated at a speed of 2500 rpm for 60 seconds to form a second layer of poly(perhydrosilazane). After the completion of the rotation, the substrate was left at rest on a hot plate heated at 90° C. and was heated for 3 minutes, which was then immediately introduced in a reaction container. An oxygen gas was introduced into the reaction container, and then, the substrate was irradiated with light of an ultraviolet lamp (mercury lamp) to induce a conversion reaction. The reaction time period was about 60 minutes, and the temperature in the reaction container was 24° C. After the reaction, the substrate with the thin film formed thereon was introduced as-is into a normal-pressure oven, and then was subjected to the heat treatment for one hour at a constant temperature (about 100° C.). The obtained $SiO_2$ thin films have a total thickness of about 200 nm, and the multi-layered film formed on the lower electrodes has a thickness of 210 nm in total. The thin film had a dielectric strength of about 4MV/cm², a resistivity of $10^{12}$ Ωcm, and a surface roughness of about 0.25 nm in RMS value.

Example 9

A commercially available polyethylene terephthalate (PET) film was used as the substrate. The substrate was placed on a spin coater, and then about 1.0 cm³ of a dibutyl ether solution of poly(perhydrosilazane) (concentration of about 20 wt %) was spread onto the substrate with a glass syringe from above. Immediately after spreading, the substrate was rotated at a speed of 2500 rpm for 60 seconds to obtain a uniform film of poly(perhydrosilazane). After the completion of the rotation, the substrate was left at rest on a hot plate heated at 50° C. and was heated for 10 minutes, which was then immediately introduced in a reaction container. An oxygen gas was introduced into the reaction container. The pressure of the oxygen gas introduced in this stage was 0.01 to 0.03 MPa. Then, the substrate was irradiated with light of an ultraviolet lamp (mercury lamp). The irradiation time period was set at about 60 minutes. The temperature in the reaction container was room temperature (24° C.). After the reaction, the substrate with the thin film formed thereon was introduced as-is into a normal-pressure oven, and then was subjected to the heat treatment for one hour at a constant temperature (about 50° C.). The obtained $SiO_2$ thin film (sealing layer) has a thickness of about 250 nm. Onto the $SiO_2$ thin film, gold was vacuum-deposited to a thickness of 50 nm as patterned lower electrodes. The substrate was placed on a spin coater, and then about 1.0 cm³ of an ethanol solution (concentration of about 0.51 wt %) of polyvinyl alcohol (PVA) was spread onto the substrate with a glass syringe from above. Immediately after spreading, the substrate was rotated at a speed of 600 rpm for 10 seconds, and subsequently was subjected to the heating and firing process at 60° C. for three hours to obtain a uniform film (thickness of about 10 nm) of PVA. Further, about 1.0 cm³ of a dibutyl ether solution (concentration of about 20 wt %) of poly(perhydrosilazane) was spread with a glass syringe onto the substrate on which the thin film had been formed, and then immediately, the substrate was rotated at a speed of 2500 rpm for 60 seconds to form a second layer of poly(perhydrosilazane). After the completion of the rotation, the substrate was left at rest on a hot plate heated at 90° C. and was heated for 3 minutes, which was then immediately introduced in a reaction container. An oxygen gas was introduced into the reaction container, and then, the substrate was irradiated with light of an ultraviolet lamp (mercury lamp) to conduct a conversion reaction. The reaction time period was about 60 minutes, and the temperature in the reaction container was 24° C. After the reaction, the substrate with the thin film formed thereon was introduced as-is into a normal-pressure oven, and then was subjected to the heat treatment for one hour at a constant temperature (about 100° C.). The obtained $SiO_2$ thin films have a total thickness of about 200 nm, and the multi-layered film formed on the lower electrodes has a thickness of 210 nm in total. The thin film had a dielectric strength of about 4MV/cm$^2$, a resistivity of $10^{10}$ Ωcm, and a surface roughness of about 0.28 nm in RMS value.

Example 10

The substrate with the SiO$_2$ thin film produced in Example 2 was placed and sealed in a glove box (H$_2$O concentration of 10 ppm or less) which contains a chloroform solution of hexamethyldisilazane (0.25 vol %). At this point, the substrate was not immersed into the solution. Silazane treatment on the SiO$_2$ thin film was performed by heating this closed container at 50° C. for 15 minutes to expose the SiO$_2$ thin film to a vapor of the hexamethyldisilazane solution. The substrate subjected to the silazane treatment was cleaned by chloroform. Next, a pentacene thin film was produced as a semiconductor active layer on the substrate by a vacuum evaporation method. Commercially available pentacene was purchased and purified by repeating the sublimative purification five times for use in this example. Conditions for vacuum evaporation are that the substrate was fixed above the vapor-deposition boat, the substrate temperature was adjusted to about 30° C., and the pressure was reduced until the degree of vacuum reaches $2 \times 10^{-6}$ Torr. Thereafter, the vacuum evaporation was performed to a thickness of 50 nm at a rate of 2 nm per minute. Then, as shown in FIG. 1, as the source and drain electrodes 60, gold was vacuum-evaporated using a mask made of nickel in a size having 100 μm width and 0.05 μm thickness. At this point, the distance between the source and the drain was 20 μm. Electric current flowing between the source and the drain when a gate bias was applied from the gate electrode was measured for such produced element. FIG. 4 shows the output characteristics of the thin film transistor measured as described above. The field effect mobility obtained from these characteristics was 0.36 cm$^2$/Vs.

Example 11

The substrate with the SiO$_2$ thin film produced in Example 2 was placed and sealed in a glove box (H$_2$O concentration of 10 ppm or less) which contains a chloroform solution of hexamethyldisilazane (0.25 vol %). At this point, the substrate was not immersed into the solution. Silazane treatment on the SiO$_2$ thin film was performed by heating this closed container at 50° C. for 15 minutes to expose the SiO$_2$ thin film to a vapor of the hexamethyldisilazane solution. The substrate subjected to the silazane treatment was cleaned by chloroform. Next, as the source and drain electrodes 60, gold was vacuum-evaporated using a mask made of nickel in a size having 100 μm width and 0.05 μm thickness. At this point, the distance between the source and the drain is 20 μm. Next, a poly(3-hexylthiophene) thin film was produced by a cast method, as a semiconductor active layer. Commercially available poly(3-hexylthiophene) was purchased, which was then extractively purified with liquid chromatography for use in this example. A sample stock solution was obtained by the purified poly(3-hexylthiophene) into desiccated toluene. The concentration at this point was about 0.1 wt %. About 0.1 mL of the poly(3-hexylthiophene) solution was dripped between the source and the drain to form a thin film of an active layer. Such produced thin film transistor produced operates as a bottom contact type thin film transistor. Then, such produced element was deaerated in a probe station in a vacuum of about $1 \times 10^{-2}$ Pa for about one hour, and then the output characteristics of the transistor was measured. The field effect mobility of such produced thin film transistor was about $1 \times 10^{-3}$ cm$^2$/Vs.

Reference Example 1

As a contrast experiment, the performance as an insulating film of a thermally oxidized silicon film formed on a silicon wafer, instead of a SiO$_2$ insulating film obtained from conversion of a silicon compound, was studied as is the case with the foregoing examples. FIG. 5 shows the XPS pattern of the thermally oxidized silicon film. This is approximately the same as that of the SiO$_2$ thin film obtained from conversion of polysilazne shown in FIG. 2A, indicating that the polysilazane-converted SiO$_2$ thin film is a SiO$_2$ thin film having approximately the same quality as that of the thermally oxidized silicon film. The SiO$_2$ thin film had a thickness of about 300 nm, a dielectric strength of about 8MV/cm, a resistivity of $10^{15}$ Ωcm, a relative dielectric constant of about 3.9, and a surface roughness of about 0.14 nm in RMS value.

The thermally oxidized silicon film (SiO$_2$ thin film) produced as described above was placed and sealed in a glove box (H$_2$O concentration of 10 ppm or less) which contains a chloroform solution of hexamethyldisilazane (0.25 vol %). At this point, the film was not immersed into the solution. Silazane treatment on the SiO$_2$ thin film was performed by heating this closed container at 50° C. for 15 minutes to expose the SiO$_2$ thin film to a vapor of the hexamethyldisilazane solution. The substrate subjected to the silazane treatment was cleaned by chloroform. Next, a pentacene thin film was produced as a semiconductor active layer on the substrate by a vacuum evaporation method. Commercially available pentacene was purchased and purified by repeating the sublimative purification five times for use in this example. Conditions for vacuum evaporation are that the substrate was fixed above the vapor-deposition boat, the substrate temperature was adjusted to about 30° C., and the pressure was reduced until the degree of vacuum reaches $2 \times 10^{-6}$ Torr. Thereafter, the vacuum evaporation was performed to a thickness of 30 nm at a rate of 2 nm per minute. Then, as shown in FIG. 1, as the source and drain electrodes 60, gold was vacuum-evaporated using a mask made of nickel in a size having 100 μm width and 0.05 μm thickness. At this point, the distance between the source and the drain was 20 μm. Electric current flowing between the source and the drain when a gate bias was applied from the gate electrode was measured for such produced element. FIG. 6 shows the output characteristics of the thin film transistor measured as described above. The field effect mobility obtained these characteristics was 0.30 cm/Vs. In consequence, it is found that the performance of the pentacene thin film transistor with the silazane-converted SiO$_2$ thin film is approximately equal to that of the transistor with the thermally oxidized silicon film.

INDUSTRIAL APPLICABILITY

A thin film transistor of the present invention is easily produced and enables the achievement of a film element, a large-area element and a flexible element, since it is able to be produced on a plastic substrate with plasticity by coating. For this reason, an electron circuit used as parts of mobile electronic equipment excellent in anti-shock properties can be mass-produced at low cost. In addition, the thin film transistor of the present invention results in increase of element stability and lifetime, since the sealing and insulating layers is composed from highly stable metallic oxides.

The invention claimed is:

1. A process for producing a sealing layer and/or a gate insulating layer of a thin film transistor, the thin film transistor comprised of the sealing layer formed of a thin film layer including a silicon oxide thin film located on a plastic substrate having plasticity, a gate electrode, the gate insulating layer formed of a thin film layer including a silicon oxide thin film, source and drain electrodes, and a semiconductor active layer, wherein the gate insulating layer has a surface roughness of 0.5 nm or less in a RMS value, the method of forming the sealing layer and/or the gate insulating layer comprising:
  preparing, as a starting material, a silicon compound having at least a silazane bond (Si—N) and a siloxane bond (Si—O) in a molecule;
  bringing the starting material into a solution;
  coating the solution to form a precursor layer of the gate insulating layer or a precursor layer of the sealing layer; and
  irradiating the precursor layer of the gate insulating layer or the precursor layer of the sealing layer with light in an atmosphere including oxygen to convert the precursor layer of the gate insulating layer or the precursor layer of the sealing layer to the gate insulating layer or to the sealing layer, respectively.

2. The process according to claim 1, wherein the silicon compound comprises at least one of materials constituting constitutional units expressed by the following general formula (1) or (2):

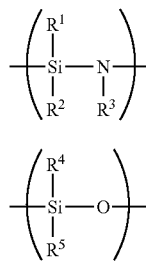

wherein $R^1$, $R^2$, $R^3$, $R^4$, and $R^5$ independently represents a substituent group selected from the group consisting of a hydrogen atom, an alkyl group, an alkenyl group, an alkoxy group, a hydroxyalkyl group, a carboxylalkyl group, an alkylcarbonyl group, an alkoxycarbonyl group, an alkylcarbonyloxy group, an aromatic hydrocarbon group and an aromatic heterocyclic group.

3. The process according to claim 2, wherein the silicon compound is selected from the group consisting of cyclotetrasilazane, oligosilazane, polysilazane and alkylsiloxane.

4. The process according to claim 1, wherein the irradiating is conducted with ultraviolet light.

5. The process for producing a thin film transistor according to claim 1, wherein the silicon oxide thin film is subjected to firing at a temperature of 150° C. or less either during or after the irradiating.

6. A process for producing a sealing layer and/or a gate insulating layer of a thin film transistor, the thin film transistor comprised of the sealing layer formed of a thin film layer including a silicon oxide thin film located on a plastic substrate having plasticity, a gate electrode, the gate insulating layer formed of a thin-film layer including a silicon oxide thin film, source and drain electrodes, and a semiconductor active layer, wherein the gate insulating layer has a surface roughness of 0.5 nm or less in a RMS value, the method of forming the sealing layer and/or the gate insulating layer comprising:
  preparing, as a starting material, a silicon compound having a silazane bond (Si—N);
  bringing the starting material into a solution;
  coating the solution to form a precursor layer of the gate insulating layer or a precursor layer of the sealing layer; and
  irradiating the precursor layer of the gate insulating layer or the precursor layer of the sealing layer with light in an atmosphere including oxygen to convert the precursor layer of the gate insulating layer or the precursor layer of the sealing layer to the gate insulating layer or to the sealing layer, respectively.

7. The process according to claim 6, wherein the silicon compound comprises at least one of materials constituting constitutional units expressed by the following general formula (1):

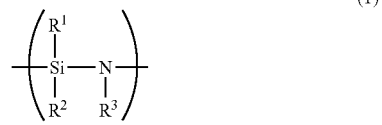

wherein $R^1$, $R^2$, and $R^3$ independently represents a substituent group selected from the group consisting of a hydrogen atom, an alkyl group, an alkenyl group, an alkoxy group, a hydroxyalkyl group, a carboxylalkyl group, an alkylcarbonyl group, an alkoxycarbonyl group, an alkylcarbonyloxy group, an aromatic hydrocarbon group and an aromatic heterocyclic group.

8. The process according to claim 7, wherein the silicon compound is selected from at least one of cyclotetrasilazane, oligosilazane and polysilazane.

9. The process according to claim 6, wherein the irradiating is conducted with ultraviolet light.

10. The process according to claim 6, wherein the silicon oxide thin film is subjected to firing at a temperature of 150° C. or less either during or after irradiating.

11. The process according to claim 6, wherein the silicon compound does not have a siloxane bond (Si—O).

* * * * *